United States Patent
Sudo et al.

(10) Patent No.: US 7,453,117 B2
(45) Date of Patent: Nov. 18, 2008

(54) NON-VOLATILE SEMICONDUCTOR MEMORY DEVICE

(75) Inventors: Naoaki Sudo, Kanagawa (JP); Kohji Kanamori, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 11/453,796

(22) Filed: Jun. 16, 2006

(65) Prior Publication Data

US 2006/0289922 A1    Dec. 28, 2006

(30) Foreign Application Priority Data

Jun. 22, 2005    (JP)    ............... 2005-181851

(51) Int. Cl.
*H01L 29/76*    (2006.01)
(52) U.S. Cl. .................. 257/314; 257/315; 257/316; 257/317; 257/E29.129; 257/E29.03; 257/E21.422; 257/E21.068
(58) Field of Classification Search .......... 257/314, 257/315–317, E29.129, E29.03, E21.422, 257/E21.068
See application file for complete search history.

(56) References Cited

U.S. PATENT DOCUMENTS 3,979,680 A * 9/1976 Sakamoto ............... 455/186.1
6,515,907 B2    2/2003    Miyagi
6,894,339 B2 *    5/2005    Fan et al. ............... 257/314
2005/0023591 A1    2/2005    Ding
2005/0062091 A1    3/2005    Ding

FOREIGN PATENT DOCUMENTS

| CN | 1371129 | 9/2002 |
|---|---|---|
| CN | 1577801 | 2/2005 |
| JP | 2002-237191 | 8/2002 |

OTHER PUBLICATIONS

Chinese Office Action dated Mar. 7, 2008, with English translation.

* cited by examiner

*Primary Examiner*—Cuong Q Nguyen
*Assistant Examiner*—Tran Q Tran
(74) *Attorney, Agent, or Firm*—McGinn IP Law Group, PLLC

(57) ABSTRACT

To achieve a high-speed and reliable read operation. A unit cell is constituted by a select gate 3 provided in a first region and on a substrate 1 with an insulating film 2 interposed inbetween, a floating gate 6a provided in a second region adjacent to the first region with an insulating film 5 interposed inbetween, a diffusion region 7a provided in a third region adjacent to the second region and on the surface of the substrate, and a control gate 11 provided on the top of the floating gate 6a with an insulating film 8 interposed inbetween. Each data bit is stored using corresponding first unit cell and second unit cell.

15 Claims, 10 Drawing Sheets

(READ OPERATION)

NON-VOLATILE SEMICONDUCTOR MEMORY DEVICE

FIELD OF THE INVENTION

The present invention relates to a non-volatile semiconductor memory device having a cell transistor and particularly to a non-volatile semiconductor memory device that enables a high-speed and stable read operation.

BACKGROUND OF THE INVENTION

Among conventional non-volatile semiconductor memory devices, there are ones in which each data bit is held by two non-volatile memory elements for storing data having a complementary logic relationship, a differential sense amplifier is used for read operations, and its inputs IN+ and IN− respectively receive the potentials at data lines (Conventional Example 1; refer to Patent Document 1). By employing such a structure, it becomes possible to read data reliably even when a difference between the threshold voltages of the two non-volatile memory elements is small, and since a small potential difference can be detected, it becomes possible to read data of a pair of non-volatile memory elements having a small difference in the threshold value between a depletion state, in which data writing depth is shallow, and an enhancement state.

Further, among conventional non-volatile semiconductor memory devices, a non-volatile semiconductor memory device shown in FIGS. 6 to 8 is known (Conventional Example 2). The non-volatile semiconductor memory device relating to Conventional Example 2 comprises first diffusion regions 107, select gates 103, second diffusion regions (121 in FIG. 6), floating gates 106, and control gates 111 in a memory cell array (refer to FIGS. 6 and 7).

The first diffusion regions 107 extend in one direction on the surface of a substrate 101. They are disposed in parallel and separated from each other. The first diffusion regions 107 are used as local bit lines (LB in FIG. 8). The select gates 103 are provided in a region between the juxtaposed first diffusion regions 107 and on the substrate 101 with an insulating film 102 interposed in between. They extend in the direction in which the first diffusion regions 107 extend. The second diffusion regions (121 in FIG. 6) are provided outside the cell region on the surface of the substrate 101 and underneath the select gates 103. On both sides outside the cell region, they extend in the direction perpendicular to the direction in which the select gates 103 extend. The second diffusion regions (121 in FIG. 6) are used as common sources. The floating gates 106 are memory nodes and are provided in a region between the first diffusion regions 107 and the select gates 103 with the insulating film 102 interposed in between. Viewed from a direction, normal to plane (termed as "plane direction", herein after) they are provided insularly. The control gates 111 are provided on the top of the floating gates 106 and the select gates 103 with an insulating film 108 interposed in between. They are disposed in parallel and separated from each other, and extend in the direction perpendicular to the direction in which the select gates 103 extend. The control gates 111 are used as word lines (W0 to W15 in FIG. 8).

One of the first diffusion regions 107 disposed on both sides of the select gate 103, the floating gate 106, the control gate 111, and the select gate 103 constitute a first unit cell, and the other first diffusion region 107 out of the first diffusion regions 107 disposed on both sides of the select gate 103, the floating gate 106, the control gate 111, and the select gate 103 constitute a second unit cell. The first unit cell and the second unit cell share a channel underneath the select gates 103. In this non-volatile semiconductor memory device, an inversion layer 120 is formed in the cell region underneath the select gate 103 and on the surface of the substrate 101 by applying a positive voltage to the select gates 103.

Referring to FIG. 8, the local bit lines LB are electrically connected to global bit lines GB via selection switches SW. Each global bit line is electrically connected to a corresponding sense amplifier SA. The sense amplifiers SA amplify potential differences between the global bit lines GB and a reference global bit line RGB. The reference global bit line RGB is electrically connected to each of the sense amplifiers SA.

The operation of the non-volatile semiconductor memory device relating to Conventional Example 2 will be described with reference to the drawings. FIG. 9 is a schematic diagram for explaining the read operation (when electrons are not accumulated (changed) in the floating gate) of the semiconductor memory device relating to Conventional Example 2.

In a read operation, the first unit cell or the second unit cell is selected and read. Referring to FIG. 9, in a state in which electrons are not accumulated in the floating gate 106 (erased state; low threshold voltage), electrons e run from the first diffusion region 107 through a channel underneath the floating gate 106, further run through the inversion layer 120 formed underneath the select gate 103, and move to the second diffusion region (121 in FIG. 6) when a positive voltage is applied to the control gate 111, the select gate 103, and the second diffusion region (121 in FIG. 6). On the other hand, in a state in which electrons are accumulated in the floating gate 106 (written state; high threshold voltage), even when a positive voltage is applied to the control gate 111, the select gate 103, and the second diffusion region (121 in FIG. 6), the electrons e do not flow because there is no channel underneath the floating gate 106 (not shown in the drawing). The read operation is performed by interpreting data (0/1) based on whether or not the electrons e flow.

Compared to the non-volatile semiconductor memory device relating to Conventional Example 1, the non-volatile semiconductor memory device relating to Conventional Example 2 is structured such that it reads the object storage node of an independent unit cell facing the non-object storage node with the select gate 103 interposed in between by having the channel of the select gate 103 serving as the drain and performing a read operation without going through the non-object storage node of the other unit cell, and since it practically functions as a 1-bit cell, the chip size and chip cost can be reduced and stable circuit operation can be achieved.

[Patent Document 1]
    Japanese Patent Kokai Publication No. JP-P2002-237191A, whose entire disclosure is incorporated herein by reference thereto.

SUMMARY OF THE DISCLOSURE

However, the non-volatile semiconductor memory device relating to Conventional Example 2 cannot perform a high-speed read operation because the read margin during the read operation is small, which offers disadvantage. The reason for this is because the difference potential (the difference between a first potential and a reference potential and the difference between a second potential and the reference potential) supplied to the sense amplifier SA at the time of a read operation is one half of the amplitude between the first potential and the second potential (refer to FIG. 10) since the intermediate potential between the first potential when the selected unit cell that is being read is "0" and the second potential when it is "1" is used as the reference potential.

It is a main object of the present invention to achieve a high-speed and stable read operation.

According to a first aspect of the present invention, in a non-volatile semiconductor memory device, one unit cell is made up by a select gate provided in a first region on a substrate, a memory node provided in a second region adjacent to the first region, a diffusion region provided in a third region adjacent to the second region and on the surface of the substrate, and a control gate provided on the top of the memory node; each data bit being stored using two of the corresponding unit cells.

In the non-volatile semiconductor memory device of the present invention, it is preferable that the two corresponding unit cells share a channel underneath the select gate.

In the non-volatile semiconductor memory device of the present invention, it is preferable that the two corresponding unit cells store data bit so that they are in a complementary logic relationship and that they employ a True/Bar structure in which one of the two corresponding unit cell holds "0" and the other unit cell holds "1."

In the non-volatile semiconductor memory device of the present invention, it is preferable that it comprises a sense amplifier that amplifies a difference potential between a first potential extracted from a diffusion region of one of the two corresponding unit cells and a second potential extracted from a diffusion region of the other cell of the two corresponding unit cells during a read operation.

In the non-volatile semiconductor memory device of the present invention, it is preferable that the sense amplifier be electrically connected to the diffusion region of the one of the unit cells via a first bit line and a first selection switch and be electrically connected to the diffusion region of the other cell via a second bit line and a second selection switch.

According to a second aspect of the present invention, in a non-volatile semiconductor memory device comprising a plurality of unit cells, one unit cell is constituted by a select gate provided in a first region on a substrate, first and second memory nodes provided in second and third regions on both sides of and adjacent to the first region, a diffusion region provided adjacent to the second and the third regions and facing the first region, and a control gate provided on the top of the first and the second memory nodes and the select gate; each data bit being stored by having the first and the second memory nodes of the unit cell store data having a complementary logic relationship.

The meritorious effects of the present invention are summarized as follows.

According to the present invention (aspects 1 to 2), compared with a non-volatile semiconductor memory device using a reference potential, a high-speed and stable read operation can be achieved since the reference potential is not necessary and a large difference potential can be obtained at the sense input during a read operation. In other words, a high-speed and high-reliability operation can be achieved by a complementary read operation.

BRIEF DESCRIPTIONS OF THE DRAWINGS

PREFERRED EMBODIMENTS OF THE INVENTION

Embodiment 1

Figure 1:
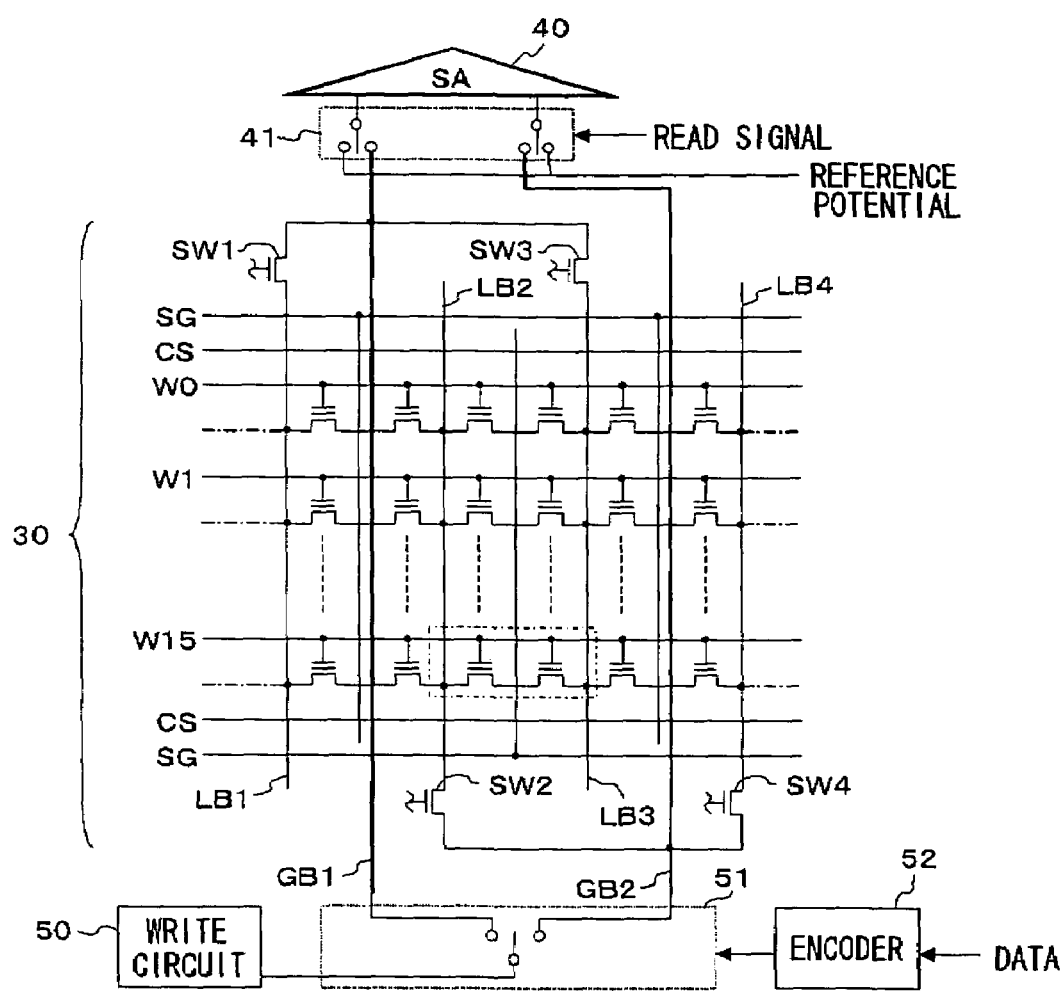
FIG. 1 is a circuit diagram schematically illustrating the structure of a non-volatile semiconductor memory device relating to Embodiment 1 of the present invention.

A non-volatile semiconductor memory device relating to a first embodiment of the present invention will be described with reference to the drawings. FIG. 1 is a circuit diagram schematically illustrating the structure of the non-volatile semiconductor memory device relating to the first embodiment of the present invention.

Figure 6:
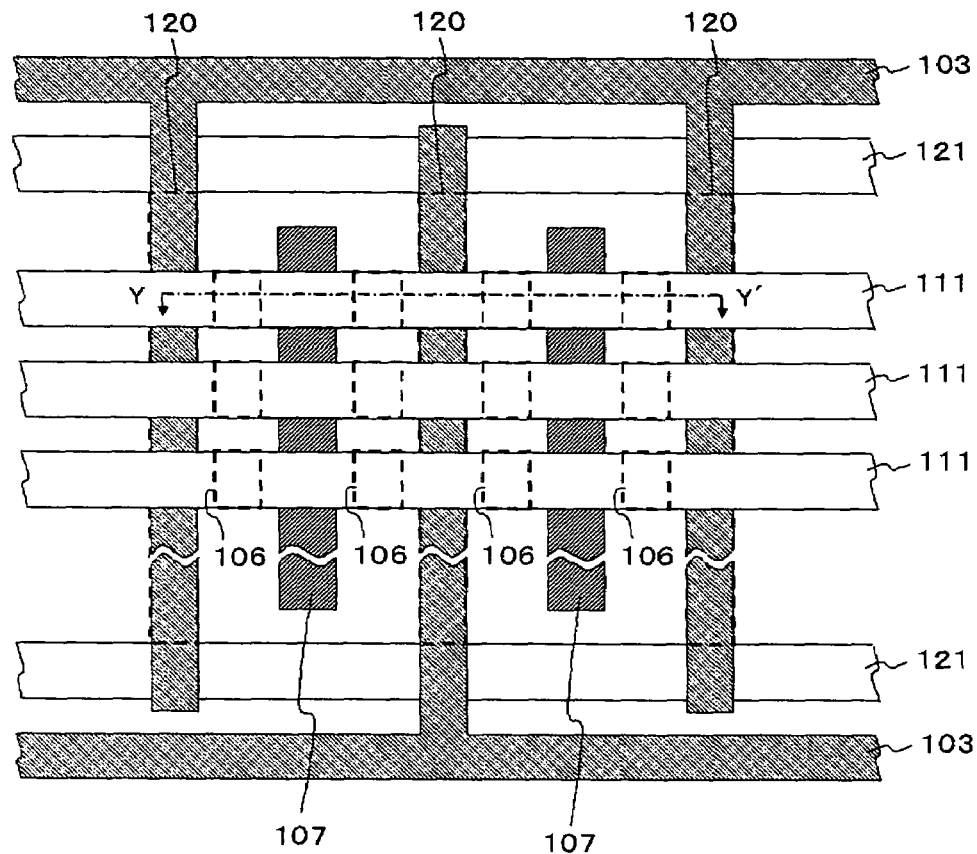
FIG. 6 is a partial plan view schematically illustrating the structure of a non-volatile semiconductor memory device relating to Conventional Example 2.
Figure 7:
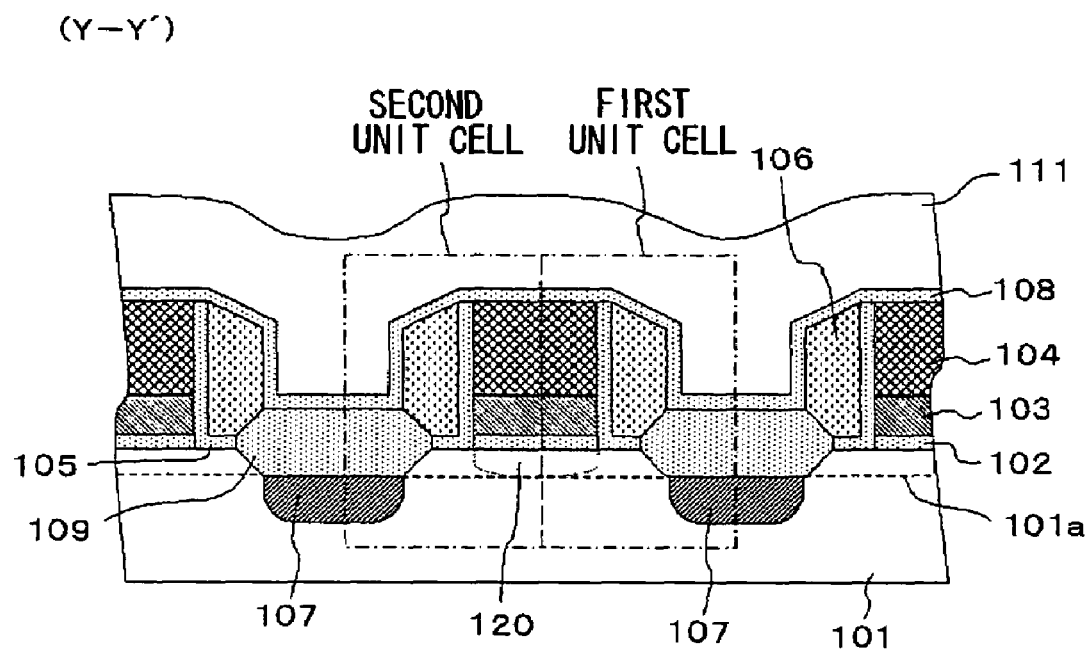
FIG. 7 is a partial cross-sectional view taken along a line Y-Y' (in FIG. 6) schematically illustrating the structure of the non-volatile semiconductor memory device relating to Conventional Example 2.

The non-volatile semiconductor memory device relating to Embodiment 1 and the non-volatile semiconductor memory device of Conventional Example 2 shown in FIGS. 6 and 7 are similar in the sense that they have the same memory cell array. The aforementioned disclosure in the background relating to conventional Example 2 are incorporated herein by reference thereto for reference purpose.

Figure 8:
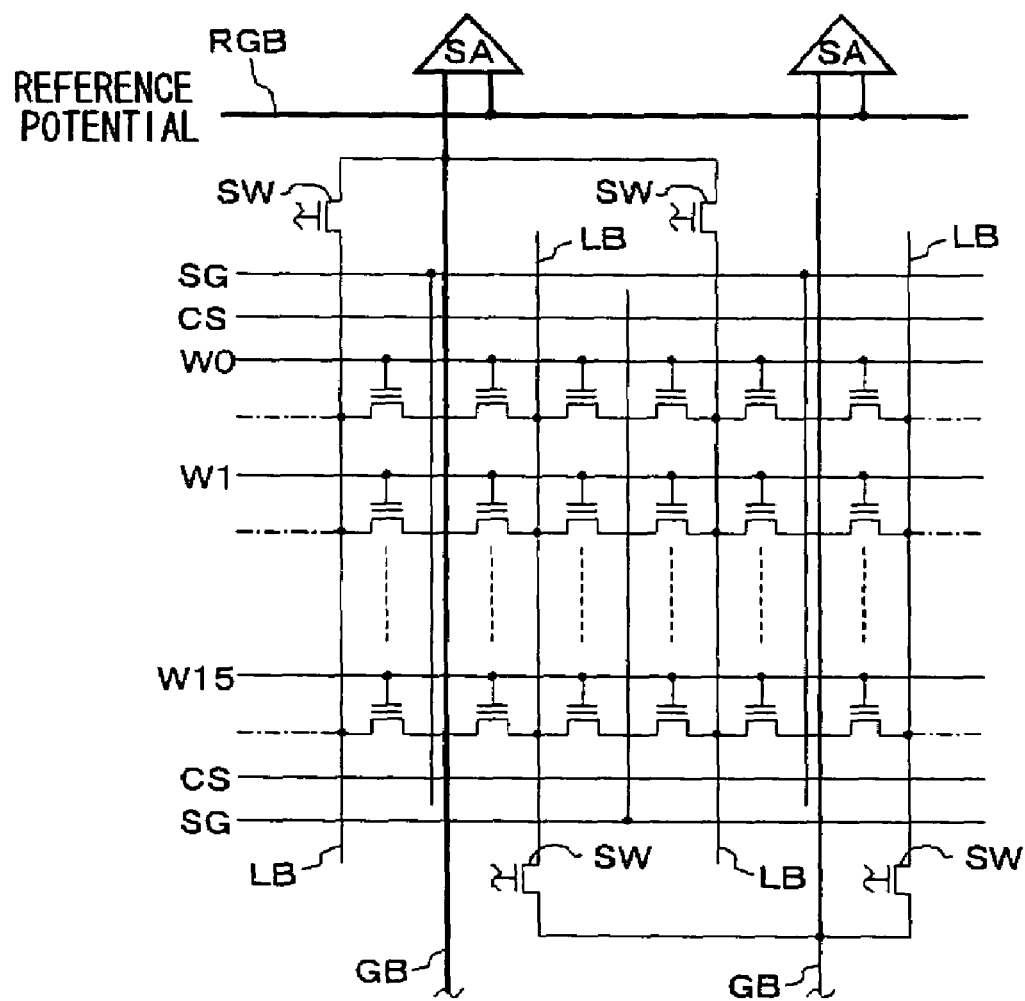
FIG. 8 is a circuit diagram schematically illustrating the internal circuit of the non-volatile semiconductor memory device relating to Conventional Example 2.
Figure 9:
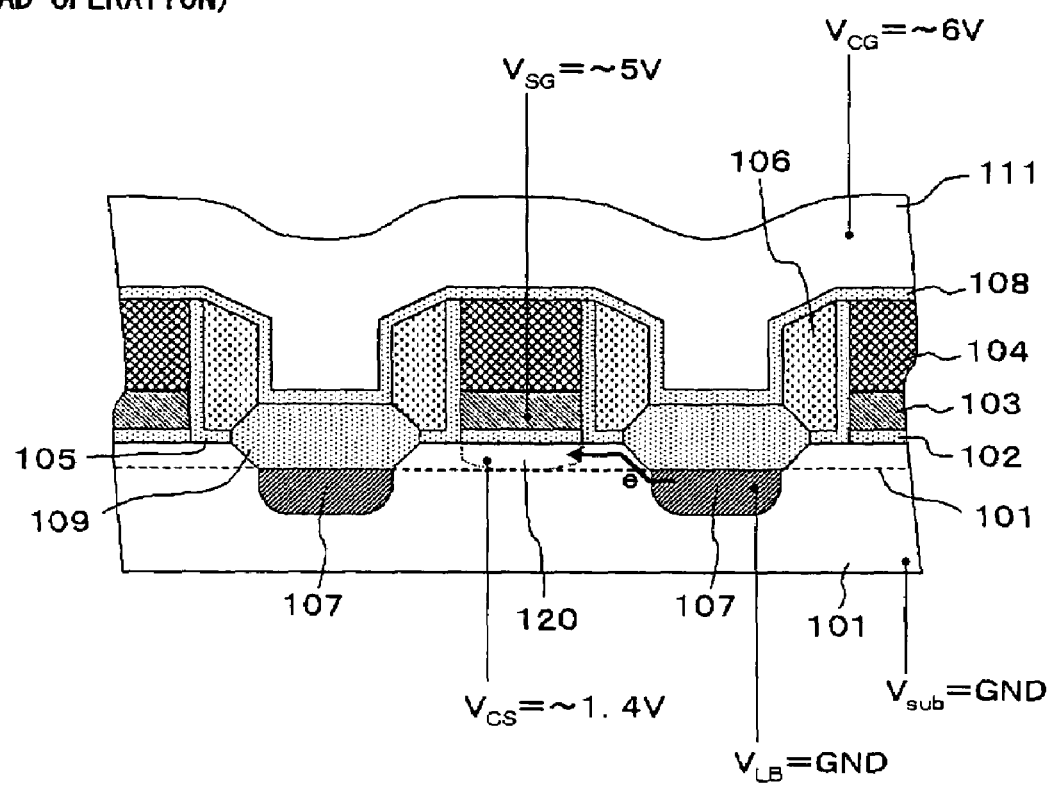
FIG. 9 is a schematic diagram for explaining the read operation (when electrons are not accumulated in the floating gate) of the semiconductor memory device relating to Conventional Example 2.
Figure 10:
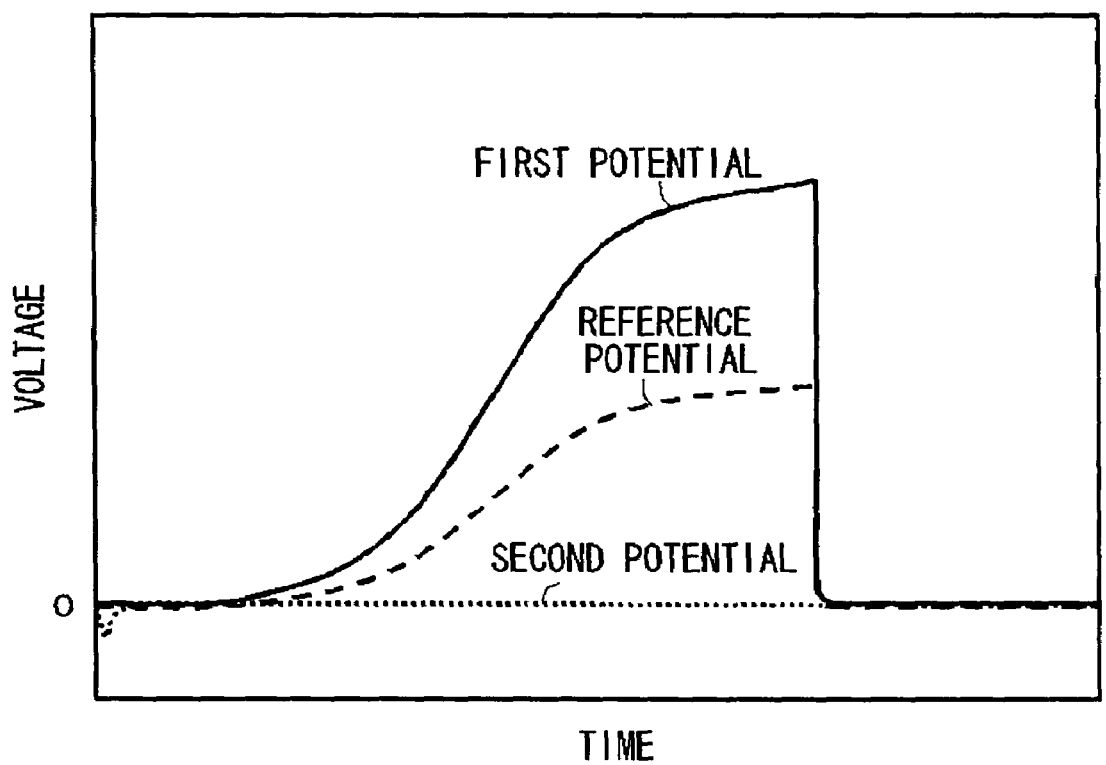
FIG. 10 is a diagram schematically showing how a first potential, a second potential and a reference potential of the non-volatile semiconductor memory device relating to Conventional Example 2 change over time.

The non-volatile semiconductor memory device comprises a cell block 30, a sense amplifier 40, a switching circuit 41, a write circuit 50, a switching circuit 51, and an encoder 52. Note that, in Embodiment 1, the device does not have the reference global bit line RGB in the cell region unlike Conventional Example 2 in FIG. 8.

In the cell block 30, m rows (the abscissa, X axis) and n columns (the ordinate, Y axis) of the memory cells shown in FIG. 7 (a pair of the first unit cell and the second unit cell) are provided in a matrix form. A plurality of global bit lines GB1 and GB2 are provided over the cell block 30. Local bit lines LB1 and LB3 branching off from the global bit lines GB1 and electrically connected to the global bit lines GB1 via selection switches SW1 and SW3 are provided in the cell block 30. Further, local bit lines LB2 and LB4 branching off from the global bit lines GB2 and electrically connected to the global bit lines GB2 via selection switches SW2 and SW4 are provided in the cell block 30. Each of the local bit lines LB1 to LB4 is electrically connected to the first diffusion region (107 in FIG. 7). Note that switching of the selection switches SW1 to 4 is performed by a Y-decoder (not shown in the drawing).

In the cell block 30, common sources CS are provided on both sides outside the cell region and branch lines of select gates SG are provided so that they intersect with the two common sources CS. Note that there may be only one common source CS on one side instead of two in the cell block 30. Word lines W0 to W15 are provided over the cell block 30. The word lines W0 to W15 are electrically connected to corresponding control gates (111 in FIG. 7). The word lines W0 to W15 are electrically connected to a X-decoder (not shown in the drawing) for applying voltages to the word lines W0 to W15 specified by an address signal. Note that, in FIG. 1, SG corresponds to the select gates 103 in FIG. 6 and CS corresponds to the common sources, i.e., the second diffusion regions 121 in FIG. 6.

Figure 2:
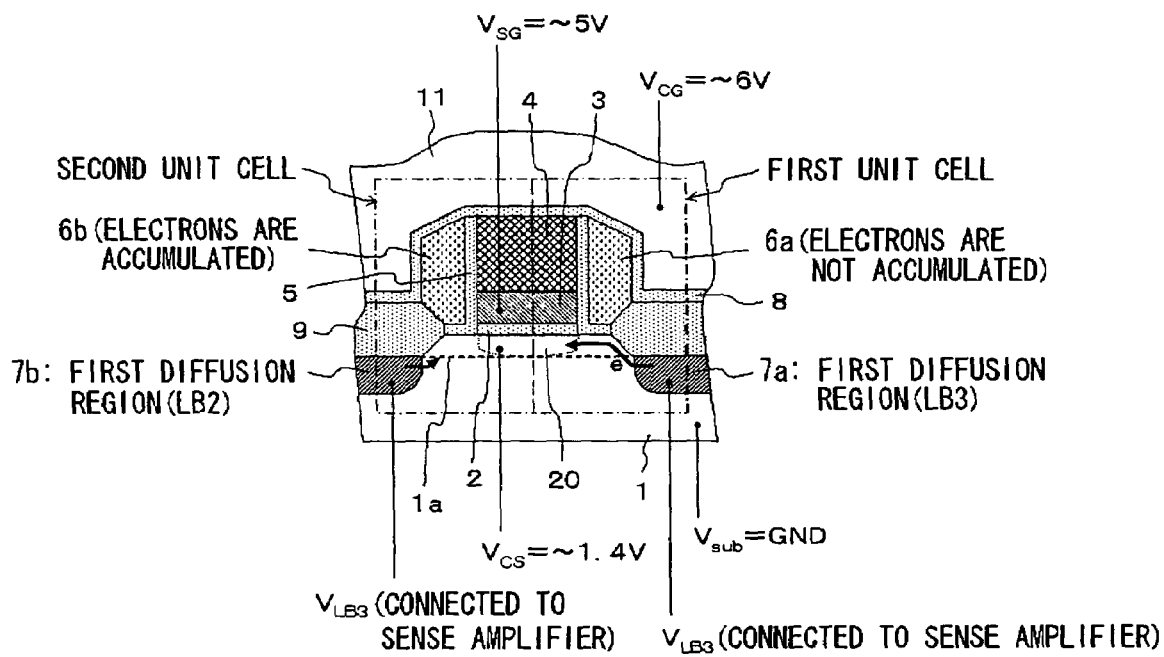
FIG. 2 is a schematic diagram for explaining an example of the read operation of the non-volatile semiconductor memory device relating to Embodiment 1 of the present invention.

FIG. 2 is a cross-sectional view of a memory cell (a pair of the first unit cell and the second unit cell) indicated by a (dotted) chain line in FIG. 1. In the memory cell in FIG. 2, each data bit is stored so that it has a complementary logic relationship. In other words, it employs a True/Bar structure in which "0" or "1" data is held in one unit cell and the opposite data is held in the other unit cell. For instance, when the first unit cell 7a holds "0" and the second unit cell 7b holds "1," the entire memory cell holds data "0." Further, when the first unit cell 7a holds "1" and the second unit cell 7b holds "0," the entire memory cell holds data "1." (Refer to Table 1.)

TABLE 1

| Held data | The first unit cell | The second unit cell |
|---|---|---|
| "0" | "0" | "1" |
| "1" | "1" | "0" |

The sense amplifier 40 amplifies a potential difference between the global bit lines GB1 and GB2 when the switching circuit 41 receives a read signal for performing a read operation and amplifies a potential difference between the global bit lines GB1 or GB2 and a reference potential when the switching circuit 41 receives a non-read signal for not performing a read operation. Upon receiving the read signal, the switching circuit 41 switches so that the global bit lines GB1 and GB2 are electrically connected to the sense amplifier 40. On the other hand, when receiving the non-read signal, it switches so that one of the global bit lines GB1 or GB2 and a reference wire (the wire in which the reference potential flows) are electrically connected to the sense amplifier 40.

The write circuit 50 is a circuit that outputs a predetermined potential to the switching circuit 51 during a write operation. The switching circuit 51 switches the electrical connections between one of the global bit lines GB1 or GB2 and the write circuit 50 when it receives an encoded signal from the encoder 52. Upon receiving write data, the encoder 52 encodes the write data into 2-bit data, and it outputs the encoded signal to the switching circuit 51.

Figure 3:
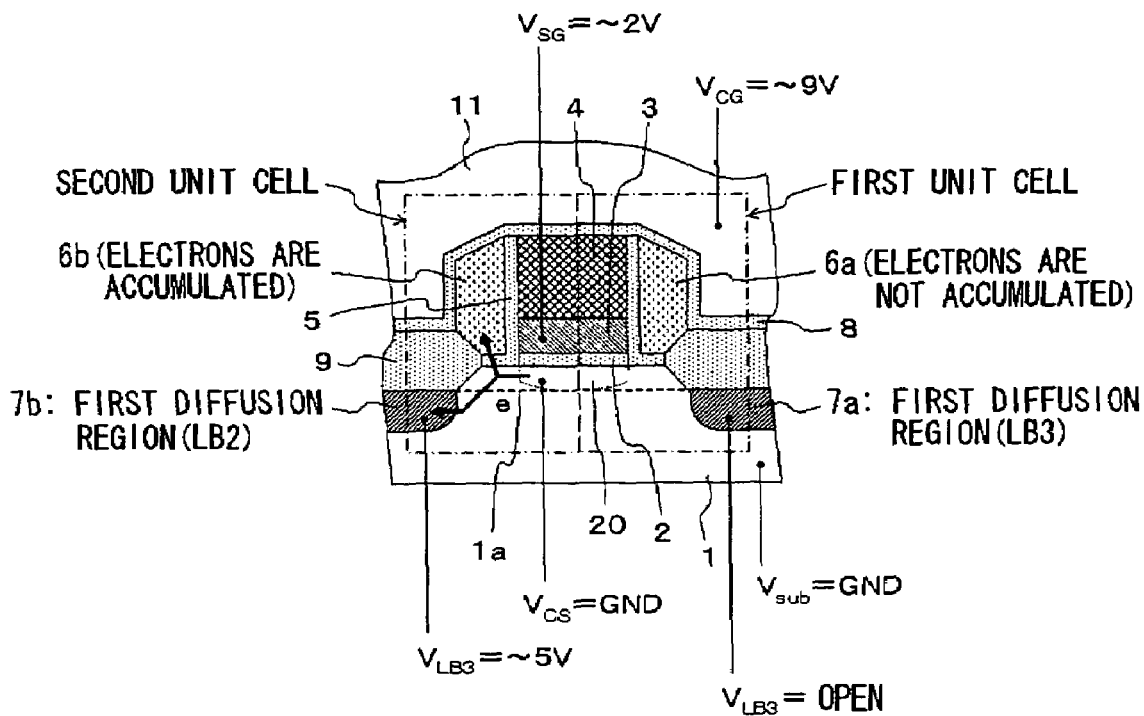
FIG. 3 is a schematic diagram for explaining an example of the write operation of the non-volatile semiconductor memory device relating to Embodiment 1 of the present invention.
Figure 4:
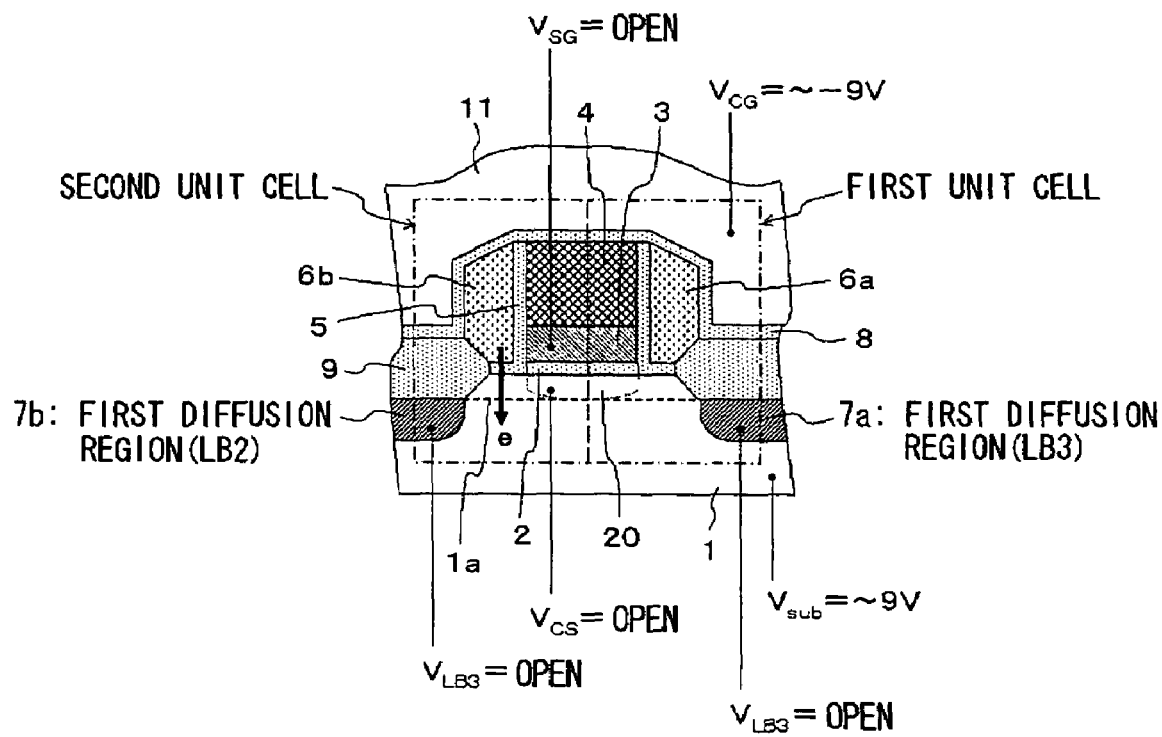
FIG. 4 is a schematic diagram for explaining an example of the erase operation of the non-volatile semiconductor memory device relating to Embodiment 1 of the present invention.
Figure 5:
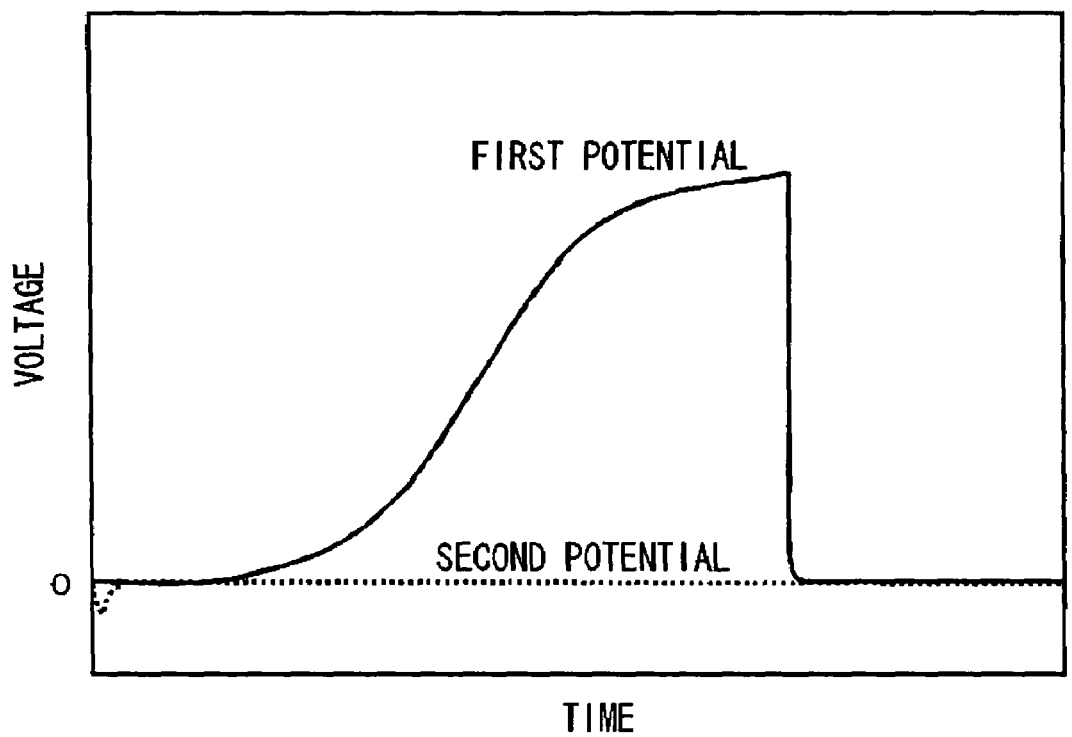
FIG. 5 is a diagram schematically showing how a first potential and a second potential of the non-volatile semiconductor memory device relating to Embodiment 1 of the present invention change over time.

Next, the read operation of the non-volatile semiconductor memory device relating to Embodiment 1 of the present invention will be described with reference to the drawings. FIG. 2 is a schematic diagram for explaining an example of the read operation of the non-volatile semiconductor memory device relating to Embodiment 1 of the present invention. FIG. 3 is a schematic diagram for explaining an example of the write operation of the non-volatile semiconductor memory device relating to Embodiment 1 of the present invention. FIG. 4 is a schematic diagram for explaining an example of the erase operation of the non-volatile semiconductor memory device relating to Embodiment 1 of the present invention. FIG. 5 is a diagram schematically showing how a first potential and a second potential of the non-volatile semiconductor memory device relating to Embodiment 1 of the present invention change over time. Note that, in FIG. 5, the first potential is the potential when the unit cell that performs a read operation is ON ("1") and the second potential is the potential when the unit cell that performs a read operation is OFF ("0").

The read operation will be described. Here, a state in which electrons are not accumulated in a floating gate 6a, but they are in a floating gate 6b (a state in which the first unit cell holds "0" and the second unit cell holds "1") will be explained. Referring to FIG. 2, the both cells—the corresponding first unit cell and second unit cell—are read in a read operation in Embodiment 1. This is different from Conventional Example 2, in which only one unit cell is read. For instance, when the memory cell surrounded by the chain line in FIG. 1 (a pair of the first unit cell and the second unit cell) is being read, SW1 is OFF, SW2 is ON, SW3 is ON, and SW4 is OFF. Further, upon receiving a read signal, the switching circuit 41 switches so that the global bit lines GB1 and GB2 are electrically connected to the sense amplifier 40. Note that the switching circuit 51 does not electrically connect the write circuit 50 and the global bit lines GB1 and GB2. At this time, a positive voltage is applied to the control gate 11 (the word line W15 in FIG. 1; for instance 6V), the select gates 3 (SG in FIG. 1; for instance 5V), and the second diffusion regions (common sources CS; for instance 1.4V), and a substrate 1 is connected to a ground GND (refer to FIG. 2). Further, the first diffusion regions 7a and 7b (LB3 and LB2 in FIG. 1) are electrically connected to the sense amplifier 40 via SW3 and SW2 respectively. Because of this, on the side of the first unit cell, electrons e run from the first diffusion region 7a through a channel directly underneath the floating gate 6a, further run through an inversion layer 20 formed underneath the select gate 3, and move to the second diffusion region (common source; 121 in FIG. 6). On the other hand, on the side of the second unit cell, even when a positive voltage is applied to the control gate 11, the select gates 3, and the second diffusion regions (common sources CS in FIG. 1), the electrons e do not flow because there is no channel underneath the floating gate 6b (not shown in the drawing). At this time, the voltage of the global bit line (GB2 in FIG. 1) electrically connected to the first diffusion region 7a (LB3 in FIG. 1) relating to the first cell unit increases as the first potential in FIG. 5. On the other hand, the voltage of the global bit line (GB1 in FIG. 1) electrically connected to the first diffusion region 7b (LB2 in FIG. 1) relating to the second cell unit does not increase as the second potential in FIG. 5. By feeding the first potential and the second potential to the sense amplifier (40 in FIG. 1), the potential difference between the first potential and the second potential is amplified and the read data is judged as "0."

The write operation will be described. Here, how a state in which electrons are not accumulated in neither the floating gate 6a nor 6b (the erased state, initial state) changes to a state in which electrons are not accumulated in the floating gate 6a, but they are in the floating gate 6b (the first unit cell holds "0" and the second unit cell holds "1") will be explained. For instance, when the memory cell surrounded by the chain line in FIG. 1 (a pair of the first unit cell and the second unit cell) is being written, SW1 is OFF, SW2 is ON, SW3 is ON, and SW4 is OFF. Further, the switching circuit 51 switches so that the write circuit 50 is electrically connected to the global bit line GB2. Upon receiving a non-read signal, the switching circuit 41 switches so that the first unit cell and the second unit cell are compared with the reference potential at the time of verification. At this time, referring to FIG. 3, a positive high voltage is applied to the control gate 11 (for instance 9V) and the first diffusion region 7b (for instance 5V), a positive low voltage is applied to the select gates 3 (for instance 2V) so that a current of 1 µA flows through the memory cell, the first diffusion region 7a is opened, and the substrate 1 and the second diffusion regions (the common sources CS in FIG. 1) are connected to GND. Because of this, the electrons e run from the second diffusion region (the common source CS in FIG. 1) through the inversion layer 20 formed underneath the select gate 3 to the first diffusion region 7b. At this time, since some of the electrons e are highly energized by an electric field at the border of the select gate 3 and the floating gates 6, they are injected into the floating gate 6b via an insulating film 5 (a tunnel oxidation film) underneath the floating gates 6. Note that the electrons e do not flow into the first diffusion region 7a from the inversion layer 20 and are not injected into the floating gate 6a since the first diffusion region 7a is open. Further, since a high-speed operation is not demanded for the write operation unlike the read operation, the sense amplifier 40 compares the written cell and the reference potential in the verify operations performed before and after the write operation.

The erase operation will be described. Here, how a state in which electrons are not accumulated in the floating gate 6a, but they are in the floating gate 6b (the first unit cell holds "0" and the second unit cell holds "1") changes to a state in which electrons are not accumulated in neither the floating gate 6a nor 6b (the erased state, initial state) will be explained. For instance, when the memory cell surrounded by the chain line in FIG. 1 (a pair of the first unit cell and the second unit cell) is being erased, SW1 is OFF, SW2 is ON, SW3 is ON, and SW4 is OFF. Note that the switching circuit 51 does not electrically connect the write circuit 50 and the global bit lines GB1 and GB2. Further, upon receiving a non-read signal, the switching circuit 41 switches so that the first unit cell and the second unit cell are compared with the reference potential at the time of verification. At this time, referring to FIG. 4, a negative high voltage is applied to the control gate 11 (for instance −9V), a positive high voltage is applied to the substrate 1 (for instance 9V), and the select gates 3, the first diffusion regions 7a and 7b, and the second diffusion regions (the common sources CS in FIG. 1) are opened. Because of this, the electrons e are drawn from the floating gate 6b to the substrate 1 through the insulating film 5 (the tunnel oxidation film) underneath the floating gate 6b. Note that the electrons are not drawn to the substrate 1 from the floating gate 6a since electrons are not accumulated in the floating gate 6a in the first place. Further, since a high-speed operation is not demanded for the erase operation unlike the read operation, the sense amplifier 40 compares the erased cell and the reference potential in the verify operations performed before and after the erase operation.

According to Embodiment 1, a non-volatile memory in which a high-speed read operation is possible can be realized because memory cells of "0" and "1" are always connected to the two input ends of the sense amplifier 40 and a maximum difference potential can be obtained. Further, since one of the two unit cells is always in an OFF state, a current flows from the inversion layer underneath the select gate SG to the sense amplifier only on the side of the unit cell in an ON state. Therefore, the voltages of the first diffusion regions (LB2 and LB3 in FIG. 1) and the global bit lines (GB1 and GB2 in FIG. 1) change quickly and a high speed-operation is possible.

Further, since read errors because of threshold shifts caused by the deterioration of memory cells are reduced, a reliable non-volatile memory can be realized.

Further, since the channel underneath the select gate SG is shared by the first unit cell and the second unit cell, the aforementioned effects can be realized with a small memory cell array. Therefore, the chip cost can be reduced.

The channel underneath the select gate SG is shared by the first unit cell and the second unit cell in Embodiment 1, however, the first unit cell and the second unit cell may be separated. In this case, in the write operation, a positive high voltage is applied to the control gate, a positive low voltage is applied to the select gates, a positive voltage is applied to the first diffusion region (drain) on the side of the unit cell that is being written (for instance the second unit cell) while the substrate and the second diffusion regions (the common sources CS) are connected to GND, and the first diffusion region (drain) on the side of the unit cell that is not being written (for instance the first unit cell) is opened.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A non-volatile semiconductor memory device comprising:
   at least two unit cells, wherein each unit cell comprises:
      a memory node provided in a second region adjacent to said first region;
      a diffusion region provided in a third region adjacent to said second region and on the surface of said substrate;
      control gate provided on the top of said memory node; and
      a sense amplifier, wherein said two corresponding ones of said unit cells are selectively connected to two input ends of said sense amplifier,
   wherein each data bit being stored uses two of corresponding ones of said unit cells.

2. The non-volatile semiconductor memory device as defined in claim 1 wherein two corresponding ones of said unit cells share a channel underneath said select gate.

3. The non-volatile semiconductor memory device as defined in claim 1 wherein two corresponding ones of said unit cells store data bit so that they are in a complementary logic relationship.

4. The non-volatile semiconductor memory device as defined in claim 1 wherein said memory device employs a True/Bar structure in which one of two corresponding said unit cells holds "0" and the other unit cell holds "1."

5. The non-volatile semiconductor memory device as defined in claim 1 wherein the sense amplifier amplifies a difference potential between a first potential extracted from a diffusion region of one of two corresponding ones of said unit cells and a second potential extracted from a diffusion region of the other cell of said two corresponding ones of said unit cells during a read operation.

6. The non-volatile semiconductor memory device as defined in claim 5 wherein said sense amplifier is electrically connected to the diffusion region of said one of the unit cells via a first bit line and a first selection switch and is electrically connected to the diffusion region of said other cell via a second bit line and a second selection switch.

7. A non-volatile semiconductor memory device comprising:
- a plurality of unit cells, wherein one unit cell comprises:
  - a select gate provided in a first region on a substrate;
  - first and second memory nodes provided in second and third regions on both sides of and adjacent to said first region;
  - a diffusion region provided adjacent to said second and third regions and facing said first region; and
  - a control gate provided on the top of said first and second memory nodes and said select gate; and
- a sense amplifier, wherein said two corresponding ones of said units cells are selectively connected to two input ends of said sense amplifier,
- wherein each data bit is stored by having said first and second memory nodes of said unit cell store data having a complementary logic relationship.

8. The non-volatile semiconductor memory device as defined in claim 5, wherein a first bit line extracted from a diffusion region of one of two corresponding ones of said unit cells and a second bit line extracted from a diffusion region of the other cell of two corresponding ones of said unit cells and a reference wire are electrically connected to the sense amplifier during a read operation.

9. The non-volatile semiconductor memory device as defined in claim 5, further comprising a first switching circuit, wherein upon receiving a non-read signal, said first switching circuit switches so that the first unit cell and the second unit cell are compared with a reference potential at the time of verification.

10. The non-volatile semiconductor memory device as defined in claim 1, further comprising a write circuit that outputs a predetermined potential to a second switching circuit.

11. The ion-volatile semiconductor memory device as defined in claim 10, further comprising an encoder that outputs an encoded signal to the second switching circuit.

12. The non-volatile semiconductor memory device as defined in claim 1, wherein said memory device further comprises local bit lines and global bit lines, wherein local bit lines branch off from the global bit lines.

13. The non-volatile semiconductor memory device as defined in claim 12, wherein said memory device further comprises selection switches for electrically connecting the local bit lines to the global bit lines.

14. The non-volatile semiconductor memory device as defined in claim 13, wherein said diffusion region is electrically connected to a sense amplifier via at least one of said selection switches.

15. A non-volatile semiconductor memory device, comprising:
- at least two unit cells, wherein each unit cell comprises:
  - a select gate provided in a first region on a substrate;
  - a memory node provided in a second region adjacent to said first region;
  - a diffusion region provided in a third region adjacent to said second region and on the surface of said substrate;
  - a control gate provided on top of said memory node; and
  - a sense amplifier, wherein said at least two unit cells are selectively connected to two input ends of said sense amplifier.

* * * * *